United States Patent
Seitz

(10) Patent No.: US 8,436,401 B2
(45) Date of Patent: May 7, 2013

(54) SOLID-STATE PHOTOSENSOR WITH ELECTRONIC APERTURE CONTROL

(75) Inventor: Peter Seitz, Urdorf (CH)

(73) Assignee: CSEM Centre Suisse D'Electronique et de Microtechnique SA, Neuchatel (CH)

( * ) Notice: Subject to any disclaimer, the term of this patent is extended or adjusted under 35 U.S.C. 154(b) by 1121 days.

(21) Appl. No.: 11/659,313

(22) PCT Filed: Jul. 27, 2005

(86) PCT No.: PCT/CH2005/000445
§ 371 (c)(1),
(2), (4) Date: Mar. 12, 2008

(87) PCT Pub. No.: WO2006/012764
PCT Pub. Date: Feb. 9, 2006

(65) Prior Publication Data
US 2009/0026508 A1    Jan. 29, 2009

(30) Foreign Application Priority Data
Aug. 4, 2004  (EP) .................................... 04405490

(51) Int. Cl.
*H01L 27/148*    (2006.01)
(52) U.S. Cl.
USPC .................... 257/222; 257/291; 257/E27.156
(58) Field of Classification Search .................. None
See application file for complete search history.

(56) References Cited

U.S. PATENT DOCUMENTS 4,481,522 A * 11/1984 Jastrzebski et al. ........... 257/229
4,994,405 A *  2/1991 Jayakar ........................... 438/75

(Continued)

FOREIGN PATENT DOCUMENTS

| DE | 100 35 135 | 1/2002 |
| RU | 2 204 973 | 7/2003 |
| WO | WO 98/10255 | 3/1998 |
| WO | WO 2004/001354 | 12/2003 |

OTHER PUBLICATIONS

R. Lange and P. Seitz, "Solid-State Time-of-Flight Range Camera", IEEE J. Quantum Electronics, vol. 37 (3), 390-397, Mar. 1, 2001.

(Continued)

*Primary Examiner* — Benjamin Sandvik
(74) *Attorney, Agent, or Firm* — Preti Flaherty Beliveau & Pachios LLP

(57) ABSTRACT

The effective photosensitive area of a solid-state photosensor is controlled with a multitude of electrodes ($E_1, \ldots, E_i, \ldots, E_n$) on top of an insulator layer (O) covering a semiconductor substrate (S). Photogenerated charge carriers move laterally under the influence of the voltage distribution on the various electrodes ($E_1, \ldots, E_i, \ldots, E_n$), and they are collected at the two ends of the photosensor in diffusions (D1, D2). The voltage distribution on the electrodes ($E_1, \ldots, E_i, \ldots, E_n$) is such that the voltage at the two furthermost electrodes ($E_1, E_n$) is maximum (if photoelectrons are collected), minimum at an interior electrode ($E_i$), and monotonously decreasing in between. The lateral position of the electrode ($E_i$) with minimum voltage defines the effective photosensitive area of the photosensor. This photosensor can be used as pixel device in image sensors, either for dynamic exposure control, for optoelectronic mixing or for demodulation, such as required in optical time-of-flight range cameras.

17 Claims, 3 Drawing Sheets

U.S. PATENT DOCUMENTS

| | | | |
|---|---|---|---|
| 5,451,802 A * | 9/1995 | Komobuchi et al. | 257/250 |
| 5,591,996 A * | 1/1997 | Haigh et al. | 257/238 |
| 5,856,667 A | 1/1999 | Spirig et al. | |
| 6,097,451 A | 8/2000 | Palmer et al. | |
| 6,556,244 B1 | 4/2003 | So et al. | |
| 6,665,485 B2 | 12/2003 | Chang et al. | |
| 6,667,768 B1 | 12/2003 | Fossum | |
| 6,825,455 B1 | 11/2004 | Schwarte | |
| 6,906,793 B2 * | 6/2005 | Bamji et al. | 356/141.1 |
| 7,053,357 B2 * | 5/2006 | Schwarte | 250/214.1 |
| 7,244,971 B2 * | 7/2007 | Sakamoto et al. | 257/184 |
| 7,352,454 B2 * | 4/2008 | Bamji et al. | 356/141.1 |
| 2002/0175350 A1 * | 11/2002 | Bosiers et al. | 257/229 |

OTHER PUBLICATIONS

S. Ando and A. Kimachi, "Correlation Image Sensor: Two-Dimensional Matched Detection of Amplitude-Modulated Light", IEEE Transactions on Electron Devices, vol. 50, No. 10 (2003), pp. 2059-2066.

A.J.P. Theuwissen in "Solid-state imaging with charge-coupled devices", Kluwer, Dordrecht, 1995, pp. 7-51 and pp. 117,118.

* cited by examiner

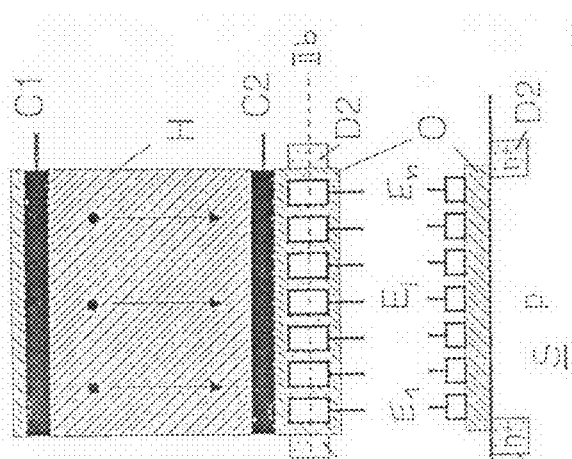
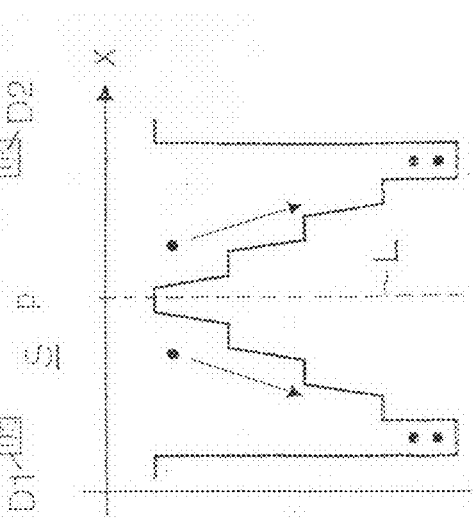
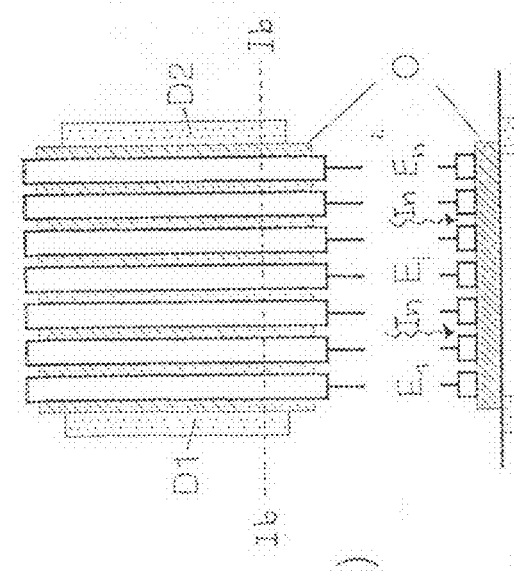
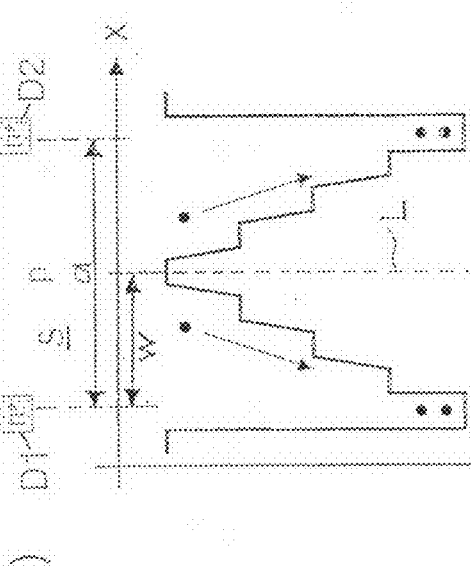

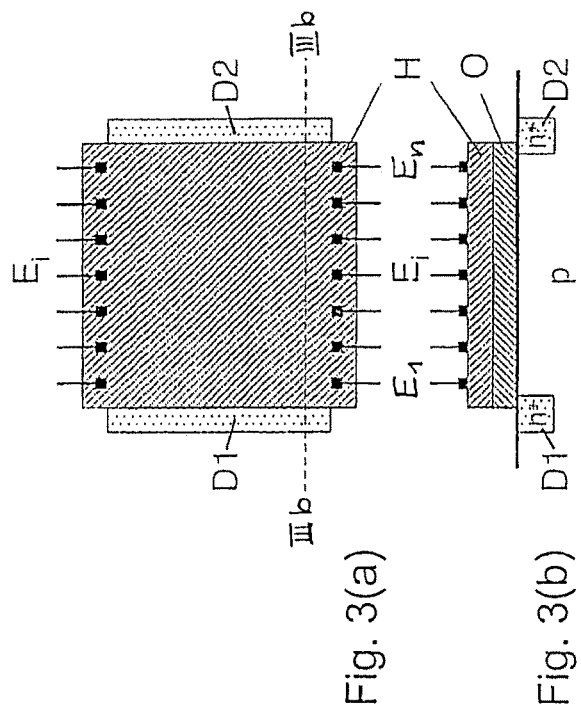
Fig. 3(a)
Fig. 3(b)
Fig. 3(c)
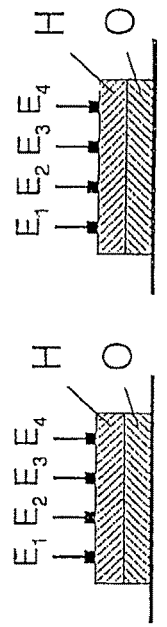
Fig. 4(a)
Fig. 4(b)
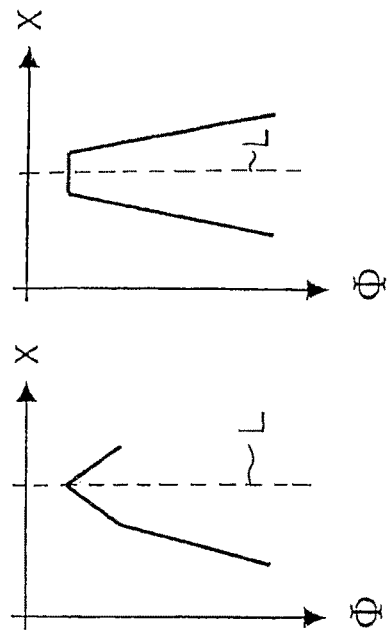
Fig. 5(a)
Fig. 5(b)

SOLID-STATE PHOTOSENSOR WITH ELECTRONIC APERTURE CONTROL

This application is a §371 national phase filing of PCT/CH2005/000445 filed Jul. 27, 2005, and claims priority to European application No. 04 405 490.6 filed Aug. 4, 2004.

FIELD OF THE INVENTION

The present invention relates to all sensing and measuring techniques that require electrical control over the effective photosensitive area in a solid-state device that is sensitive to quasi-static or temporally modulated electromagnetic wavefields, preferably in the ultraviolet, visible or infrared spectral range. When used quasi-statically, this capability is required for the dynamic control of the sensitivity of the photosensor, to replace or enhance the function of a shutter. In this way, the dynamic range of the photosensor is improved and can be adapted to the lighting conditions in a scene. When used at high frequency, this capability is required for the mixing of incident modulated light with an analog time-function, or for the demodulation of the incident light, as needed in particular for non-contact distance measurement techniques based on optical phase-shifting interferometry or on time-of-flight ranging. The present invention relates specifically to all of these sensing and measurement techniques that require dense one- or two-dimensional arrays of pixels with electronic aperture control.

BACKGROUND OF THE INVENTION

For a long time, the traditional means of adapting the limited dynamic range of a film or an optoelectronic image sensor to the widely varying lighting conditions in a scene has been the mechanical shutter. With a mechanical shutter, one can control the effectively deposited amount of incident radiation on the photosensitive area by selecting different exposure times, during which the shutter is open, while it is closed for the rest of the time. The effective fraction of detected to incident radiation is therefore determined by the duty cycle of the pulse-width modulation of the incident light through the mechanical shutter function.

An optoelectronic rather than a mechanical shutter is described in RU-2'204'973. Said patent makes use of liquid crystal elements whose polarization state can be changed as a function of an applied voltage. The device can be switched from a state of high absorption (shutter closed) to a state of low absorption (shutter open).

An electronic shutter function that is equivalent to a mechanical shutter function can be obtained with interline-transfer charge-coupled devices (IT-CCD), as described by A. J. P. Theuwissen in "Solid-state imaging with charge-coupled devices", Kluwer, Dordrecht, 1995. The exposure time is started with an electrical reset operation, which clears the storage site from all previously accumulated photocharges. During the exposure time, incident light is converted into photocharges, and these photocharges are accumulated. The exposure time is ended by transporting the accumulated photocharges under an optically shielded storage area. Also in the case of the IT-CCD the effective fraction of detected to incident radiation is determined by the duty cycle of the pulse-width modulation of the incident light through the electronic shutter function. For this reason, the switching action is binary (on-off), and neither an electrically controllable optical attenuator nor the demodulation/mixing with a continuously varying time-function is possible.

U.S. Pat. Nos. 6,667,768 and 6,556,244 describe alternative electronic shutters in image sensors that can be purely realized with industry-standard complementary metal-oxide-semiconductor (CMOS) technology. A proportional number of photocharges as a function of incident radiation energy is generated in photodiodes, and these photocharges are stored in capacitors, under the control of transistors that either electrically connect the capacitors to the photodiodes, or disconnect the electrical path between capacitors and photodiodes. In this way, an electronic shutter function is realized. Also for these inventions the switching action is binary (on-off), and neither an electrically controllable optical attenuator nor a demodulation/mixing with a continuously varying time-function is possible.

U.S. Pat. No. 5,856,667 teaches the use of CCD photodetection, switching and storage devices for the binary demodulation/mixing with a binary time-function exhibiting low noise performance, in particular for applications in optical time-of-flight range imaging. The switching action is. binary (on-off), and neither an electrically controllable optical attenuator nor a demodulation/mixing with a continuously varying time-function is possible.

An alternative approach to optoelectronic mixing is described in WO-98/10255, according to which isolated gates are switched such that all charges photogenerated under a photosite are directed to either one of two charge storage devices, where they are accumulated for subsequent processing and readout. Also in this teaching, the switching action is binary (on-off), and neither an electrically controllable optical attenuator nor a demodulation/mixing with a continuously varying time-function is possible.

The known variable optical attenuators acting on a complete image at a time, such as the one described in U.S. Pat. No. 6,665,485, employ an additional attenuating element, usually placed between the imaging lens and the surface of the image sensor. Examples include varying optical density (gradient) filters, or liquid-crystal-based attenuator elements. None of these electrically controllable optical attenuators can be implemented monolithically in the image sensor itself.

The realization of a correlation pixel capable of carrying out the correlation of a photogenerated current signal with an arbitrary time-function is described in S. Ando and A. Kimachi, "Correlation Image Sensor: Two-Dimensional Matched Detection of Amplitude-Modulated Light", *IEEE Transactions on Electron Devices*, Vol. 50, No. 10 (2003), pp. 2059-2066. The multiplication of the photocurrent with the convolution function is carried out with a multitude of transistors that are connected in series with a photodiode, and whose gates are controlled by the time-varying voltage function using different phase values. The two major disadvantages of this technique are on one hand the charge or voltage noise contributed by the channels of the multiplying transistors, and on the other hand the low operation frequency of the mixing action that is limited to a few 10 kHz, because the transistors are operated in sub-threshold where their high effective resistance leads to a low-pass RC filter action with low cutoff frequency.

WO-2004/001354 describes an optoelectronic sensing device for the local demodulation of a modulated electromagnetic wavefield. The device consists of a resistive, transparent electrode on top of an insulator layer that is produced over a semiconducting substrate whose surface is electrically kept in depletion. The electrode is connected with two or more contacts to a number of clock voltages that are operated synchronously with the frequency of the modulated wavefield. In the electrode and in the semiconducting substrate, a lateral electric field is created that separates and transports photogenerated charge pairs in the semiconductor to respective diffusions close to the contacts. The lateral electric field is acting in one direction only. By repetitively storing and accumulating photocharges in the diffusions, electrical signals are generated that are subsequently read out for the determination of local phase shift, amplitude and offset of the modulated wavefield. However, the device does not provide any electrically controllable optical attenuator.

SUMMARY OF THE INVENTION

A principle object of the invention is to provide an optoelectronic sensing device for electromagnetic radiation whose effective photosensitive aperture can be changed electrically.

A second object of the invention is to provide an optoelectronic sensing device for the local mixing or demodulation of a modulated electromagnetic wavefield, preferably in the ultraviolet, the visible and the near infrared portion of the electromagnetic spectrum, using a continuously varying mixing or demodulation time-function.

A further object of invention is to provide an architecture for a geometrical arrangement of the sensing device in one or two dimensions for the realization of line and image sensors with adaptable electronic aperture control and for the realization of line and image sensors capable of mixing or demodulating incident wavefields.

These and other objects are solved by the photosensor and the photosensing methods as defined in the independent claims. Advantageous embodiments are defined in the dependent claims.

With the foregoing objects in view, the present invention is achieved with a multitude of transparent electrodes on top of a transparent insulating layer placed on a semiconductor substrate. Photogenerated charge carriers move laterally under the influence of the voltage distribution on the various electrodes, and they are collected at the two ends of the photosensor in diffusions or in MOS structures. To this end, the voltage distribution on the electrodes is such that the voltage at the two outermost electrodes is maximum (if photoelectrons are collected), the voltage is minimum at an interior electrode, and monotonously decreasing in between. The lateral position of the electrode with minimum voltage defines the effective photosensitive area of the photosensor. Thus, a lateral electric drift field is generated at the semiconductor surface, which drift field reverses its direction along at least one straight line in the plane surface. In other words: the potential of the drift field is non-monotonic and has a global extremity, i.e., a global minimum or maximum, in the interior of the active region of the photosensor.

More specifically, the photosensor according to the invention is formed in a semiconductor substrate with a plane surface. It comprises an active region for converting incident radiation into charge carriers of a first and a second charge type, separating the charge carriers of the first charge type from the charge carriers of the second charge type and accumulating charge carriers of at least one charge type. The active region has field-generating means for generating a lateral electric drift field at the semiconductor surface in the active region. The field-generating means comprise an insulator layer formed on the semiconductor substrate and at least three conductive electrodes. Each electrode has a contact for applying an electric potential to the electrode. The electrodes are arranged above the insulator layer such that a row of at least three electrodes is formed along at least one straight line in the plane surface.

The method according to the invention for sensing incident radiation, modulated with a modulation frequency, comprises the steps of:
converting the incident radiation into charge carriers of a first and a second charge type in an active region of a photosensor formed in a semiconductor substrate with a plane surface,
generating a lateral electric drift field at the semiconductor surface in the active region,
periodically changing said drift field synchronously with the modulation frequency of the incident radiation,
separating the charge carriers of the first charge type from the charge carriers of the second charge type by means of the drift field, and
accumulating charge carriers of at least one charge type.

The drift field reverses its direction along at least one straight line in the plane surface.

When used in a quasi-static way, the photosensor according to the invention is capable of dynamic exposure control. If the position is modulated sinusoidally from left to right at the frequency of incident modulated light, this incident light can be demodulated or mixed with very little non-harmonic distortions. Because of the compact nature of this photosensor with electronic aperture control, it can be used as picture element in image sensors with a large number of such pixels, either for dynamic exposure control, for optoelectronic mixing or for demodulation, such as required in optical time-of-flight range cameras.

The photosensor with electronic aperture control according to the invention overcomes the disadvantages of the prior art in several respects. The effective geometric aperture of all pixels of an image detector can be changed with electrical signals, directly on the pixel level in the semiconductor domain, without resorting to electromechanical or optoelectronic shutters. When used as mixing or demodulation device, the photosensor according to the invention makes it possible to employ a continuous mixing or demodulation time-function. The photosensor is simple to fabricate by employing standard CCD or CMOS process technology.

BRIEF DESCRIPTION OF THE DRAWINGS

Embodiments of the invention are described in greater detail hereinafter relative to the attached schematic drawings.

FIGS. 1-3 show, for three different embodiments of the photosensor according to the invention, (a) top views, of the photosensors, (b) cross sections through the photosensors and (c) electric potential distributions at the surfaces of the semiconductor substrates.

FIGS. 4 and 5 show, for two different voltage configurations applied to the photosensor of FIG. 3, (a) cross sections through the photosensor and (b) electric potential distributions at the surface of the semiconductor substrate.

DESCRIPTION OF PREFERRED EMBODIMENTS

Figure 6:
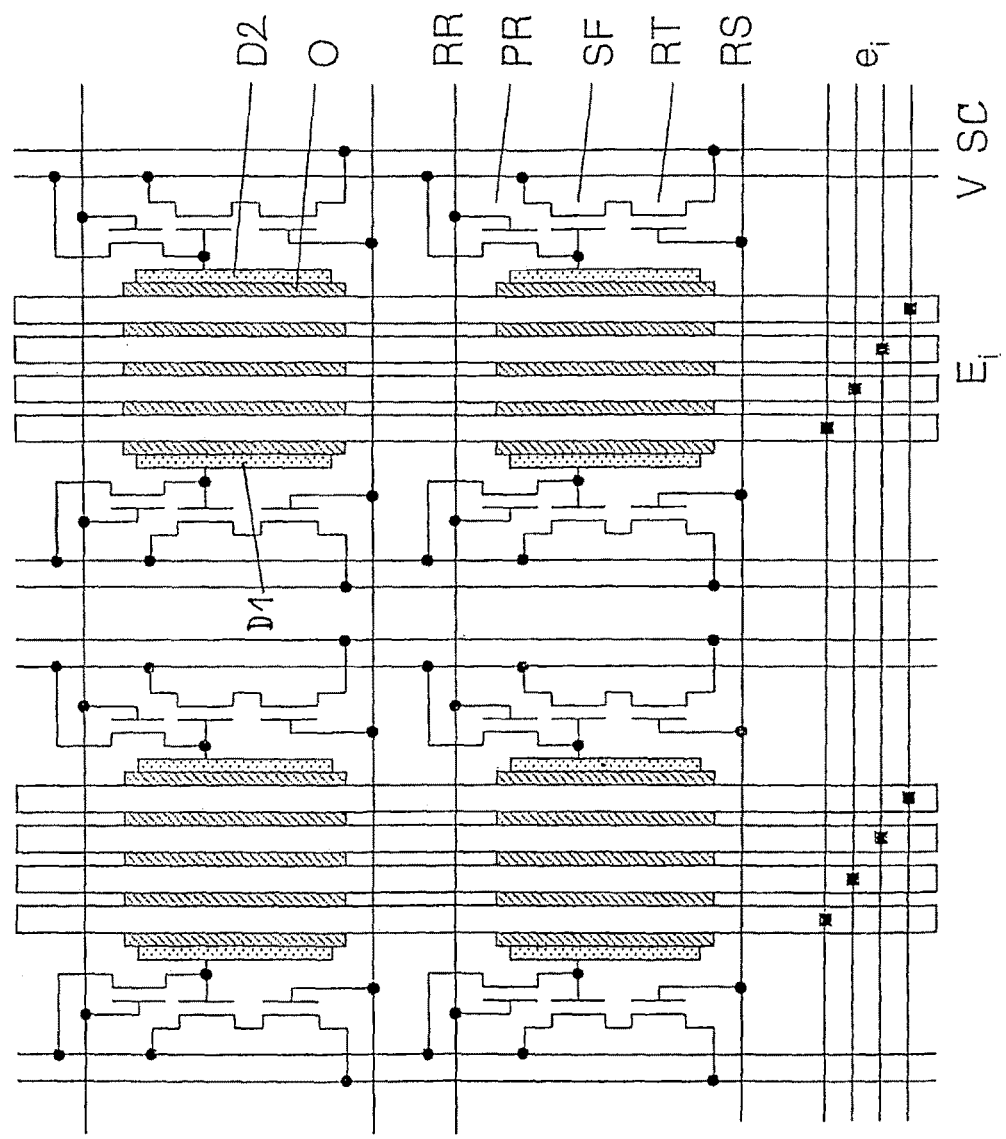
FIG. 6 shows a top view of a two-dimensional image sensor according to the invention with pixels as shown in FIG. 1.

A first embodiment of the photosensor according to the invention is shown in FIG. 1(a) in a top view and in FIG. 1(b) in a cross section. The photosensor makes use of a substrate S made of a semiconductor material such as silicon for the conversion of incident photons into electron-hole pairs. Without loss of generality, we can assume in the following that this semiconductor substrate material is p-doped, and that we want to detect photoelectrons as minority charge carriers in the semiconductor material. All subsequent arguments can be suitably modified to hold true for the detection of photogenerated holes as minority carriers in n-doped semiconductor material.

The semiconductor substrate S is covered with a preferably transparent insulator layer O, preferably an oxide, as available in industry standard CMOS processes. The thickness of the insulator layer O may vary between 1 nm and 1 μm. Thinner insulator layers O let a larger part of electric surface fields pass through into the semiconductor substrate S, but these thinner oxide layers O are more difficult to fabricate. On top of the insulator layer O, a multitude of preferably transparent, conductive electrode strips $E_1, \ldots, E_i, \ldots, E_n$ ($n \geq 3$) are arranged, as employed for example for the fabrication of charge-coupled devices (CCD). The preferred electrode material is poly-crystalline silicon, but any transparent conductive oxide (TCO), such as indium tin oxide (ITO) or zinc oxide (ZnO), or even metal can be used.

The insulator material and the electrode material should be transparent for the incident radiation In, and/or it should have openings so that the incident radiation In can be transmitted into the bulk of the semiconductor substrate S. It is also possible to thin the semiconductor substrate S to a thickness of several micrometers, and to let the radiation impinge from the back of the device, as in so-called back-illuminated photosensors.

To either side of the insulator layer O, a highly-doped n$^+$ diffusion volume D1, D2 is arranged, which can be preset to a given reference potential and to which an electronic charge-detection circuit (not shown) is connected.

By applying a specific pattern of electric potential values to the conducting electrode strips $E_1$-$E_n$, a desired lateral potential distribution $\Phi(x)$ is obtained at the interface between the semiconductor substrate S and the insulator layer O. An example of such an electric potential distribution $\Phi(x)$ is illustrated in FIG. 1(c). According to the invention, the potential distribution $\Phi(x)$ should preferably have the following properties for the detection of photoelectrons:

(a) One global potential minimum is applied to one or several electrode strips $E_i$. The position of minimum potential represents a charge-dividing line L, since photogenerated electrons will move either to the right or to the left of this charge-dividing line L.

(b) On either side of the potential minimum, the electrode voltages increase monotonously towards the outermost electrode $E_1$, $E_n$. As a consequence, the outermost electrode $E_1$, $E_n$ has the highest potential value.

(c) The diffusion wells D1, D2 that are adjacent to the outermost electrodes $E_1$, $E_n$ have electric potentials that exceed the electrode potentials.

(d) All potentials applied to the electrodes $E_1$-$E_n$, are higher than the potential at which the semiconductor substrate S is kept, so that the semiconductor material under the electrode strips $E_1$-$E_n$ is depleted, and no additional charge carriers are present other than the photogenerated charge carriers.

The charge-dividing line L divides the straight line given by the coordinate x (or the straight line Ib-Ib in FIG. 1(a)) in the plane surface of the substrate S into a first section A1 of length w and a second section A2 of length (a-w). The first and second sections A1, A2 are immediately adjacent to each other. In both sections A1, A2, the drift field is directed towards the dividing line L or is zero. Thus, the drift field reverses its direction along the straight line x.

The exemplified potential distribution $\Phi(x)$ of FIG. 1(c) has the form of a bi-directional staircase with equal steps. Incident electromagnetic radiation In is transmitted through the electrode strips $E_1$-$E_n$ and the covering insulator layer O. The incident radiation In creates photoelectrons (represent by points in FIG. 1(c)) in the bulk of the semiconductor substrate S. These photoelectrons are transported laterally either by electric field drift in areas where the potential $\Phi(x)$ varies as a function of distance, or the transport mechanism is diffusion in field-free regions in which the potential $\Phi(x)$ is constant.

The photogenerated electrons are collected by the diffusion wells D1, D2 to the left or to the right of the position of the potential minimum (i.e., of the charge-dividing line L). Therefore, the photogenerated charges collected by one diffusion well D1 represent the fraction of total photocharges corresponding to the ratio "distance from the diffusion well to the electrode with minimum potential" w divided by "total width of the insulator region" a. In the example of FIG. 1(c), half of the totally generated photocharges will be collected by the diffusion well D1 to the left, and the effective aperture is therefore w/a=50%. By suitably changing the potential distribution $\Phi(x)$ on the electrode strips $E_1$-$E_n$, the effective photosensitive area of the photosensor can be changed accordingly.

Since the diffusion wells D1, D2 have about the same length as the electrode strips $E_1$-$E_n$ in the embodiment of FIG. 1(a), their capacitance could become quite substantial. In some cases, it is desirable to collect the charge carriers in diffusion wells that have a small capacitance. Therefore, an alternative embodiment of the present invention is realized as illustrated in FIG. 2. In this embodiment, the electrode strips $E_1$-$E_n$ are short, leading to a form factor that is close to square. The length of the diffusion wells D1, D2 is also short, so that the diffusion wells D1, D2 have a correspondingly small capacitance.

In order to collect the charge carriers over a larger area, the active region is extended accordingly. Since it is necessary to transport the photoelectrons to the electrode-strip region without losing their lateral position, the transport mechanism employed must be drift in an electric field that is perpendicular to the electrode-strip arrangement. This is realized with a resistive electrode surface H on top of a large zone of the insulator layer O, consisting of a transparent, resistive material with an electrical sheet resistivity that surpasses 10 Ω/□, and preferably is more than 10 kΩ/□, e.g., many tens of kΩ/□, and up to about 1 MΩ/□. A preferred material for the realization of this resistive electrode H is poly-crystalline silicon. The resistive electrode H is contacted at its two edges with two contacts C1, C2 running along the width of the photosensor, and which are connected to a static or switchable voltage source. The voltage at the contact C2 close to the electrode strips $E_1$-$E_n$ must be lower than their potential minimum, so that photocharges move from under this contact C2 to the electrode-strip zone. Correspondingly, the voltage at the other contact C1 must be lower than the voltage at the first contact C2, leading to a current flow from the first contact C2 to the second contact C1, leading in turn to a linearly changing potential distribution perpendicular to the contacts C1, C2. This causes the desired linearly changing potential distribution at the semiconductor-insulator interface, due to which the photoelectrons move from their generation site in a perpendicular fashion to the electrode-strip zone.

As described with reference to FIG. 1, the photogenerated charges collected by one diffusion well D1 represent the fraction of total photocharges corresponding to the ratio "distance from the diffusion well to the electrode with minimum potential" w divided by "total width of the insulator region" a (cf. FIG. 1). By suitably changing the potential distribution on the electrode strips $E_1$-$E_n$, the effective photosensitive area of the photosensor can be changed accordingly, irrespective of the length a of the total photosensitive area.

Both embodiments discussed up to here lead to lateral potential distributions $\Phi(x)$ that are staircase-like. Since electric field drift is a faster charge transport mechanism than diffusion, it is desirable to employ a realization offering non-zero electric fields in the complete photosensitive (or active)

area. This can be achieved with the photosensor illustrated in FIG. 3. It comprises a resistive electrode surface H on top of the insulator O, made of a transparent, highly resistive material with an electrical sheet resistivity that surpasses 10 $\Omega/\square$, and preferably is more than 10 k$\Omega/\square$, e.g., many tens of k$\Omega/\square$, and up to about 1 M$\Omega/\square$. A series of short contact electrodes $E_1$-$E_n$ with small contact areas is fabricated in a straight line on each of the two edges of the resistive electrode H. If a pattern of voltage values is applied to the contact electrodes $E_1$-$E_n$, the resulting potential distribution $\Phi(x)$ at the semiconductor surface varies linearly between two contact electrodes $E_1$-$E_n$. The potential distribution $\Phi(x)$ linearly interpolates between the potential values beneath the contact electrodes $E_1$-$E_n$. As long as all voltages are different, the piecewise linear potential distribution $\Omega(x)$ has the desired effect of non-zero electric field and high-speed photoelectron transport in the complete photosensitive area.

Although the number n of electrodes $E_1$-$E_n$ is limited, the position of the effective dividing line L for the photocharge separation, i.e., the width of the effective w photosensitive area, is not limited to this number n and the respective discrete positions. It can rather be chosen arbitrarily by applying suitable analog voltage patterns to the electrodes $E_1$-$E_n$. This is illustrated in FIGS. 4 and 5, showing two cases of voltage distributions for the photosensor structure of FIG. 3. In the first case, illustrated in FIG. 4, a selected electrode $E_3$ of the electrodes $E_1$-$E_4$ is supplied with a minimum voltage, and the adjacent electrodes $E_2$, $E_4$ to the left and to the right have an identical, higher voltage. In this case, the dividing line L for the photocharge separation is at the center of the selected electrode $E_3$. In the second case, illustrated in FIG. 5, two adjacent electrodes $E_2$, $E_3$ are supplied with the same voltage, and their respective neighbors $E_1$, $E_4$ to the left and to the right have an identical, higher voltage. In this case, the effective photocharge dividing line L is found to lie in the middle between the two electrodes $E_2$, $E_3$ with minimum voltage. In the general case of arbitrary voltage distributions, it is possible, therefore, to realize any desired position of the photocharge dividing line L, i.e., any width w of the effective photosensitive area. Due to the complexity of real-life device construction, the accurate prediction of the actual photocharge dividing line L as a function of all parameters requires the use of high-level semiconductor-device simulation software, such as ISE-TCAD, offered commercially by Integrated Systems Engineering AG, Balgriststrasse 102, 8008 Zurich, Switzerland.

The photosensor according to the invention allows to vary the effective width w(t) (cf. FIG. 1(c)) of the photosensitive area as a function of time t. If the intensity of the incident radiation In is also modulated as a function of time t with a modulation function r(t), and if the incident radiation In is homogeneous over the whole area of the phbtosensor, then the signal s(T) that is obtained during a certain exposure time T at one of the photocharge accumulation sites is given by the integral $$s(T) = \int_0^T w(t)r(t)dt,$$

integrating from 0 to T. Since this equation represents the mixing of the two analog or digital functions w(t) and r(t), the photosensor according to the invention has also the functionality of a mixing or demodulation device.

The mixing or demodulation capability of the photosensor according to the invention can be exploited, for example, for the optical measurement of the three-dimensional shape of an object according to the time-of-flight ranging technique, as described in R. Lange and P. Seitz, "Solid-State Time-of-Flight Range Camera", *IEEE J. Quantum Electronics*, Vol. 37 (3), 390-397, 1 March 2001. An object is illuminated with a modulated source of light, and the reflected light is imaged with an optical imaging lens on a two-dimensional detection and demodulation device according to the invention. The reflected light forms a two-dimensional intensity-modulated wavefield, whose local phase delay carries the information about the local distance of the object to the detection and demodulation device, since light travels through air at a finite speed of about c=3×10$^8$ m/s. The present invention allows to measure all modulation parameters of the incident modulated wavefield, in particular the local phase delay $\tau$ in the following way. The position w(t) of the photocharge dividing line L in a photosensor is modulated with a periodic signal that has the same frequency as the modulated source of light. Preferred periodic signals are harmonic, rectangular or triangular functions of the time. The photogenerated charges Q1 and Q3 are collected in the two diffusion wells D1, D2 of the photosensor over one or many periods. A second photosensor, which is illuminated with the same reflected modulated radiation r(t), has the same modulation of the dividing line w(t) as the first photosensor, but it is 90 degrees out of phase. The photogenerated charges Q2 and Q4 are collected in the two diffusion wells of the second photosensor over the same number of periods. These charge signals Q1, Q2, Q3, Q4 can then be used for the calculation of the local phase delay $\tau$ according to the formula $$\tau = \arctan[Q4-Q2)/(Q1-Q3)].$$

Another possibility is to replace the second photosensitive photosensor with a second measurement by the first photosensitive photosensor, after the measurement values Q1 and Q3 have been stored. This assumes that the reflected modulated radiation r(t) does not change its modulation parameters during the complete exposure time required for the acquisition of Q1, Q2, Q3 and Q4. With this measurement of $\tau$, the local distance $\Lambda$ to the object, and thereby also its three-dimensional shape, is determined according to the equation $$\Lambda = c \cdot \tau / 2$$

Another method for the optical measurement of the three-dimensional shape of an object according to the time-of-flight ranging technique is described in DE-100'35'135. In this case a demodulation function w(t) is required that is as close to harmonic as possible. The photosensor according to the present invention is a particularly well-suited implementation of this required mixing device, since it carries out the mixing function with any analog time function completely in the optoelectronic domain.

It is also possible to enhance the sensitivity of the photosensor according to the invention for incident radiation In consisting of photons with energies close to the band gap of the semiconductor material S. It is known that photons with such long wavelengths (in the near infrared for silicon) penetrate deeper into the semiconductor S, to a depth which no electric field normally reaches. For this reason, photogenerated charges must rely on a thermal diffusion mechanism to reach the surface of the semiconductor substrate, where electric fields are available for fast drift transports. The thermal diffusion mechanism is slow, since the transport time depends, on average, on the square of the distance to be traveled. For this reason it is desirable to adapt the photosensor according to the invention to make is suitable also for application with long-wavelength photons. This is achieved by fabricating a volume of the opposite doping type of the semiconductor substrate S at the surface and by completely depleting this volume with a suitable voltage, the same way as in buried-channel CCDs, described for example by A. J. P. Theuwissen in "Solid-state imaging with charge-coupled devices", Kluwer, Dordrecht, 1995. In this way, the transported charge carriers are majority charge carriers, but since they move in the bulk of a completely depleted semiconductor S, they benefit from very efficient transport properties and negligible losses. The semiconductor volume of opposing conducting type is electrically connected to ground potential, and the semiconductor substrate S can be biased to a highly negative voltage of several tens of Volts in the case of a p-type substrate. In this way, the depletion region in the semiconductor substrate S extends deeply into the semiconductor bulk, to depths of several tens of micrometers. In this mode, called "deep depletion", vertical electric fields extend deeply into the semiconductor S, leading to fast and efficient drift transport of photogenerated charges also for longer wavelengths of the incident photons.

Because of its compact size, the photosensor according to the invention can be arranged in a one- or two-dimensional arrangement, for the creation of line or image sensors with electronic aperture control. This is illustrated in FIG. 6 for the example of an image sensor making use of a conventional active-pixel-sensor (APS) readout circuit. Each of the two diffusion wells D1, D2 for the accumulation of photocharges is connected to a charge-detection circuit, such as the illustrated source-follower circuit. In this exemplified circuit, each diffusion well D1, D2 is connected to the gate of a source-follower transistor SF. The source-follower transistor SF is in series with a row-select transistor RT, which is connected to a signal column SC that terminates in a load resistor or a current source. Once the charge signal is read out, the diffusion well is reset to a reference voltage on a reference-voltage line v using a pixel-reset transistor PR. In the shown circuit example, all pixel-reset transistors PR in a row are switched at the same time under the control of a row-reset signal on a row-reset-signal line RR. All row-select transistors RT in a row are switched at the same time under the control of a row-select signal on a row-select-signal line RS. The electrodes $E_i$ of all pixels in a column are electrically connected, and they are preferably realized as electrode strips having the length of the column. If the different columns should be controlled individually, each set of electrodes needs its own connections to the outside world. If it is sufficient to control the apertures of all pixels simultaneously, then the corresponding column electrodes $E_i$ of all columns can be connected to the same control-signal line $e_i$. In this way, the number of connections to the outside world is the same as the number of electrode strips $E_i$ in one column.

This invention is not limited to the preferred embodiments described above, to which variations and improvements may be made, without departing from the scope of protection of the present patent.

LIST OF REFERENCE SIGNS

| | |
|---|---|
| a | Total length of the active area |
| A1, A2 | Sections of the active area |
| C1, C2 | Contacts on resistive electrode layer |
| D1, D2 | Diffusion wells |
| $E_1$-$E_n$ | Electrodes |
| $e_1$-$e_n$ | Control signal lines |
| H | Resistive layer |
| In | Incident radiation |
| L | Charge-dividing line |
| O | Insulator layer |
| PR | Pixel-reset transistor |
| RR | Row-reset-signal line |
| RS | Row-select-signal line |
| RT | Row-select transistor |
| S | Semiconductor substrate |
| SC | Signal column |
| SF | Source-follower transistor |
| V | Reference-voltage line |
| w | Length of effective photosensitive area |
| x | Coordinate on the substrate surface |
| Φ | Electric potential on the substrate surface |

The invention claimed is:

1. A photosensor formed in a semiconductor substrate with a plane surface, said photosensor comprising an active region for converting incident radiation into charge carriers of a first and a second charge type, separating said charge carriers of said first charge type from said charge carriers of said second charge type and accumulating charge carriers of at least one charge type, said active region comprising:
a transparent insulator layer formed on said semiconductor substrate;
at least three radiation-transmissive electrodes, each radiation-transmissive electrode having a contact for applying an electric potential to said at least three radiation-transmissive electrodes;
wherein said at least three radiation-transmissive electrodes are arranged above said transparent insulator layer such that a row of said at least three radiation-transmissive electrodes is formed along at least one straight line in said plane surface;
at least one radiation-transmissive electrode between the outermost radiation-transmissive electrodes being subjectable to a global potential extremity of a lateral potential distribution;
wherein said at least three radiation-transmissive electrodes are subjectable to a voltage potential such that voltages from the global potential extremity to the outermost radiation-transmissive electrodes decrease or increase monotonically;
highly doped diffusion wells respectively adjacent to each of the two outermost radiation-transmissive electrodes of said at least three radiation-transmissive electrodes of said row for collecting said charge carriers, said highly doped diffusion wells being presettable to a given reference potential and connected to an electronic charge-detection circuit;
wherein said highly doped diffusion wells are connectable to an electric potential exceeding the potential of said at least three radiation-transmissive electrodes to generate a lateral potential distribution at said semiconductor surface in said active region;
wherein said lateral potential distribution with a global extremity between said highly doped diffusion wells causes accumulation of said at least one charge type in said highly doped diffusion wells; and
wherein said lateral potential distribution is changeable, thereby enabling the alteration of the size of the effective photosensitive area of the pixel.

2. The photosensor according to claim 1, wherein said at least three radiation-transmissive electrodes are arranged as parallel strips, each strip extending over the entire length of said active region in one dimension of said plane surface.

3. The photosensor according to claim 1, comprising a first contact, a second contact, and a resistive layer comprising a first and a second edge, wherein said resistive layer is contacted with said first edge with said first contact, and with said second edge with said second contact; and wherein said second contact is in contact with said transparent insulator layer.

4. The photosensor according to claim 3, wherein said resistive layer has a sheet resistance higher than 10 Ohms per square.

5. The photosensor according to claim 1, wherein said transparent insulator layer, and said at least three radiation-transmissive electrodes are transparent to said incident radiation.

6. The photosensor according to claim 1, wherein said at least three radiation-transmissive electrodes comprise either one of the following: polysilicon, a transparent conductive oxide and metal.

7. The photosensor according to claim 1, wherein said semiconductor substrate is a silicon substrate.

8. The photosensor according to claim 1, wherein said transparent insulator layer is an oxide layer having a thickness between 1 nm and 1000 nm.

9. The photosensor according to claim 1, wherein said diffusion wells are respectively connected to a gate of a source-follower transistor for accumulating said charge carriers.

10. The photosensor according to claim 1, wherein said photosensor is manufactured by employing at least one of the following processes: a CMOS and a CCD process.

11. An image sensor comprising a plurality of pixels arranged in a one-or two-dimensional array, wherein said pixels are photosensors according to claim 1.

12. The image sensor according to claim 11, wherein said at least three radiation-transmissive electrodes are parallel strips, each strip extending over an entire column of said image sensor.

13. The photosensor according to claim 2, wherein:

a resistive layer is placed between said transparent insulator layer and said at least three radiation-transmissive electrodes;

wherein said resistive layer has a sheet resistance higher than 10 Ohms per square;

wherein said transparent insulator layer and said at least three radiation-transmissive electrodes are transparent for said incident radiation;

wherein said at least three radiation-transmissive electrodes comprise either one of the following: polysilicon, a transparent conductive oxide and metal;

wherein said semiconductor substrate is a silicon substrate;

wherein said transparent insulator layer is an oxide layer having a thickness between 1 nm and 1000 nm;

wherein either one of the following: a diffusion well and an integration gate, for accumulating charge carriers is provided close to at least one of the outermost radiation-transmissive electrodes of the row of at least three radiation-transmissive electrodes;

further comprising an electronic circuit for reading out the accumulated charge carriers; and wherein said photosensor is manufactured by employing at least one of the following processes: a CMOS and a CCD process.

14. The photosensor according to claim 2, wherein:

a resistive layer is placed between said transparent insulator layer and said at least three radiation-transmissive electrodes;

wherein said resistive layer has a sheet resistance higher than 10 Ohms per square;

wherein said transparent insulator layer and said at least three radiation-transmissive electrodes are transparent for said incident radiation;

wherein said at least three radiation-transmissive electrodes comprise either one of the following: polysilicon, a transparent conductive oxide and metal;

wherein said semiconductor substrate is a silicon substrate;

wherein said transparent insulator layer is an oxide layer having a thickness between 1 nm and 1000 nm;

wherein either one of the following: a diffusion well and an integration gate, for accumulating charge carriers is provided close to at least one of the outermost radiation-transmissive electrodes of the row of at least three radiation-transmissive electrodes;

further comprising an electronic circuit for reading out the accumulated charge carriers; and wherein said photosensor has been manufactured by employing only one of the following processes: a CMOS and a CCD process.

15. An image sensor comprising a plurality of pixels arranged in a one-or two-dimensional array, wherein:

said pixels are photosensors according to claim 13; and said at least three radiation-transmissive electrodes are parallel strips, each strip extending over an entire column of the image sensor.

16. An image sensor comprising a plurality of pixels arranged in a one-or two-dimensional array, wherein;

said pixels are photosensors according to claim 14; and said at least three radiation-transmissive electrodes are parallel strips, each strip extending over an entire column of the image sensor.

17. The photosensor according to claim 3, wherein said resistive layer is transparent.

* * * * *